US009846554B1

(12) United States Patent
Lai et al.

(10) Patent No.: US 9,846,554 B1
(45) Date of Patent: Dec. 19, 2017

(54) STORAGE SYSTEM AND METHOD FOR GROUPING BLOCKS BASED ON DETERMINISTIC DATA PATTERNS

(71) Applicant: SanDisk Technologies LLC, Plano, TX (US)

(72) Inventors: Joanna Lai, San Jose, CA (US); Nian Niles Yang, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/228,910

(22) Filed: Aug. 4, 2016

(51) Int. Cl.
G11C 16/04 (2006.01)
G06F 3/06 (2006.01)

(52) U.S. Cl.
CPC .......... G06F 3/0647 (2013.01); G06F 3/0604 (2013.01); G06F 3/064 (2013.01); G06F 3/0679 (2013.01)

(58) Field of Classification Search
CPC ...... G06F 3/0647; G06F 3/0604; G06F 3/064; G06F 3/0679
See application file for complete search history.

(56) References Cited

U.S. PATENT DOCUMENTS 8,432,768 B2 * 4/2013 Ware .................. G11C 7/04
365/189.011
8,806,156 B2 * 8/2014 Yamamoto ............ G06F 3/0608
711/103
8,935,466 B2 * 1/2015 Ellis .................... G06F 12/0246
365/185.29

* cited by examiner

Primary Examiner — Pho M Luu
(74) Attorney, Agent, or Firm — Brinks Gilson & Lione

(57) ABSTRACT

A storage system and method for generating block allocation groups based on deterministic data patterns are provided. A storage system is provided comprising a memory comprising a plurality of blocks and a controller. The controller is configured to infer characteristics of the memory from data patterns of data stored in the plurality of blocks; and group the plurality of blocks based on the inferred characteristics of the memory.

24 Claims, 13 Drawing Sheets

STORAGE SYSTEM AND METHOD FOR GROUPING BLOCKS BASED ON DETERMINISTIC DATA PATTERNS

BACKGROUND

Some storage systems contain a memory that is organized into a plurality of memory blocks. Such storage systems can allocate blocks randomly or based on logical block address. For example, a storage system can allocate center blocks (i.e., lowest logical block addresses) for single-bit-per-cell (X1) blocks purely based on address.

DETAILED DESCRIPTION

Overview

Figure 1A:
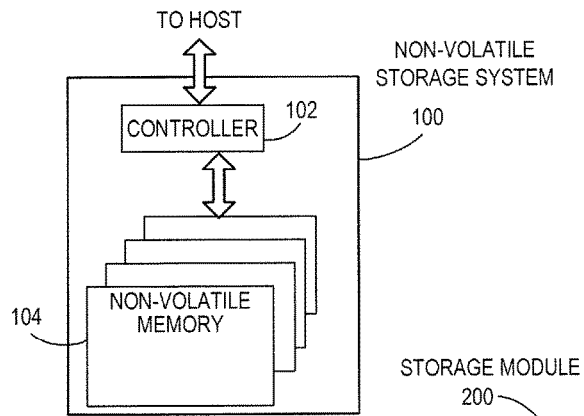
FIG. 1A is a block diagram of a non-volatile storage system of an embodiment.

By way of introduction, the below embodiments relate to a storage system and method for grouping blocks based on deterministic data patterns. In one embodiment, a storage system is provided comprising a memory comprising a plurality of blocks and a controller. The controller is configured to infer characteristics of the memory from data patterns of data stored in the plurality of blocks; and group the plurality of blocks based on the inferred characteristics of the memory.

In some embodiments, the data pattern comprises one of the following: program every single memory cell in a block and program every other cell in a block.

In some embodiments, characteristics of the memory comprises program speed.

In some embodiments, characteristics of the memory comprises natural variation.

In some embodiments, characteristics of the memory comprises four neighbor interference.

In some embodiments, characteristics of the memory comprises word line inference.

In some embodiments, characteristics of the memory comprises bit line inference.

In some embodiments, the memory comprises a three-dimensional memory.

In some embodiments, the storage system is embedded in a host.

In some embodiments, the storage system is removably connected to a host.

In another embodiment, a method is provided for grouping blocks based on deterministic data patterns. The method is performed in a storage system having a memory comprising a plurality of blocks and comprises programming bits in the plurality of blocks; and for each block: reading the programmed bits in the block; and assigning the block to a block type based on how many of the read bits pass a threshold.

In some embodiments, programming bits comprises one of the following: programming every single memory cell in a block and programming every other cell in a block.

In some embodiments, the block type is a characteristic of program speed.

In some embodiments, the block type is a characteristic of natural variation.

In some embodiments, the block type is a characteristic of four neighbor interference.

In some embodiments, the block type is a characteristic of word line inference

In some embodiments, the block type is a characteristic of bit line inference.

In some embodiments, the memory comprises a three-dimensional memory.

In some embodiments, the storage system is embedded in a host.

In some embodiments, the storage system is removably connected to a host.

In another embodiment, a storage system is provided comprising a memory comprising a plurality of blocks; means for analyzing characteristics of the memory from data patterns of data stored in the memory; and means of categorizing the plurality of blocks of the memory based on the inferred characteristics of the memory.

In some embodiments, the memory comprises a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Exemplary Embodiments

Figure 1B:
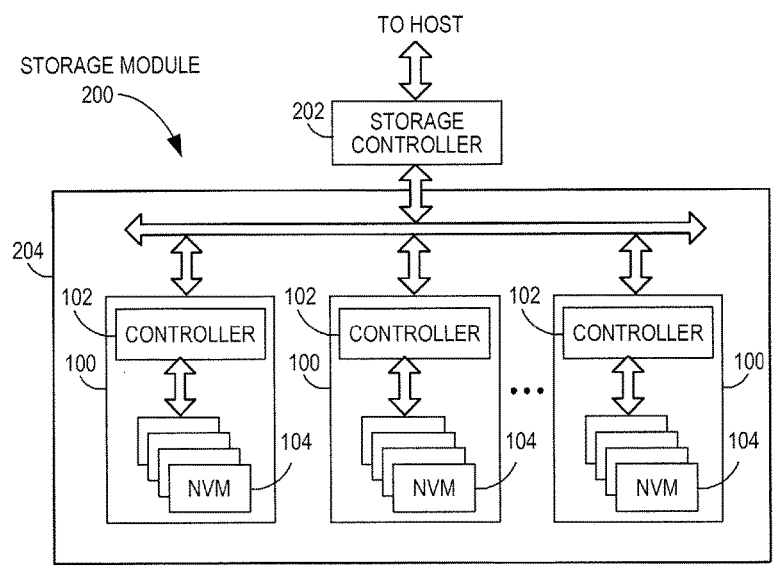
FIG. 1B is a block diagram illustrating an exemplary storage module of an embodiment.
Figure 1C:
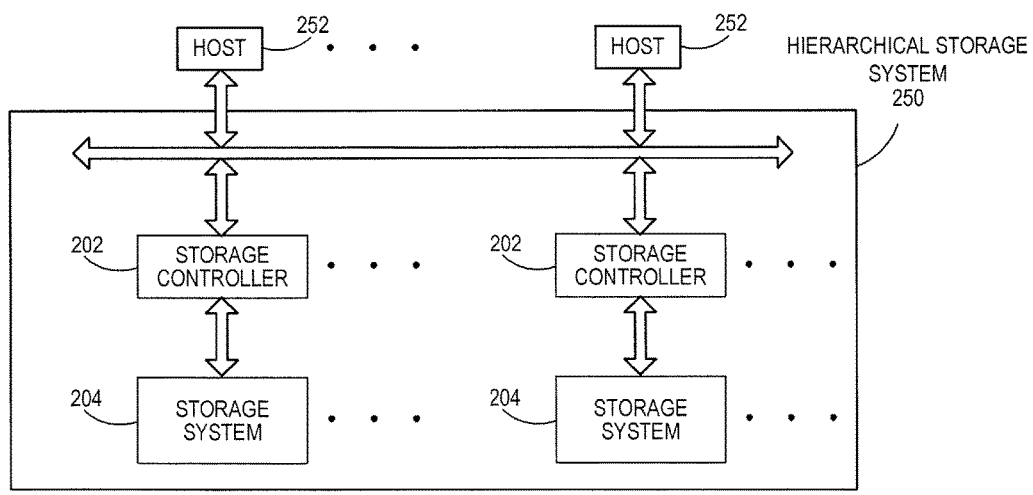
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
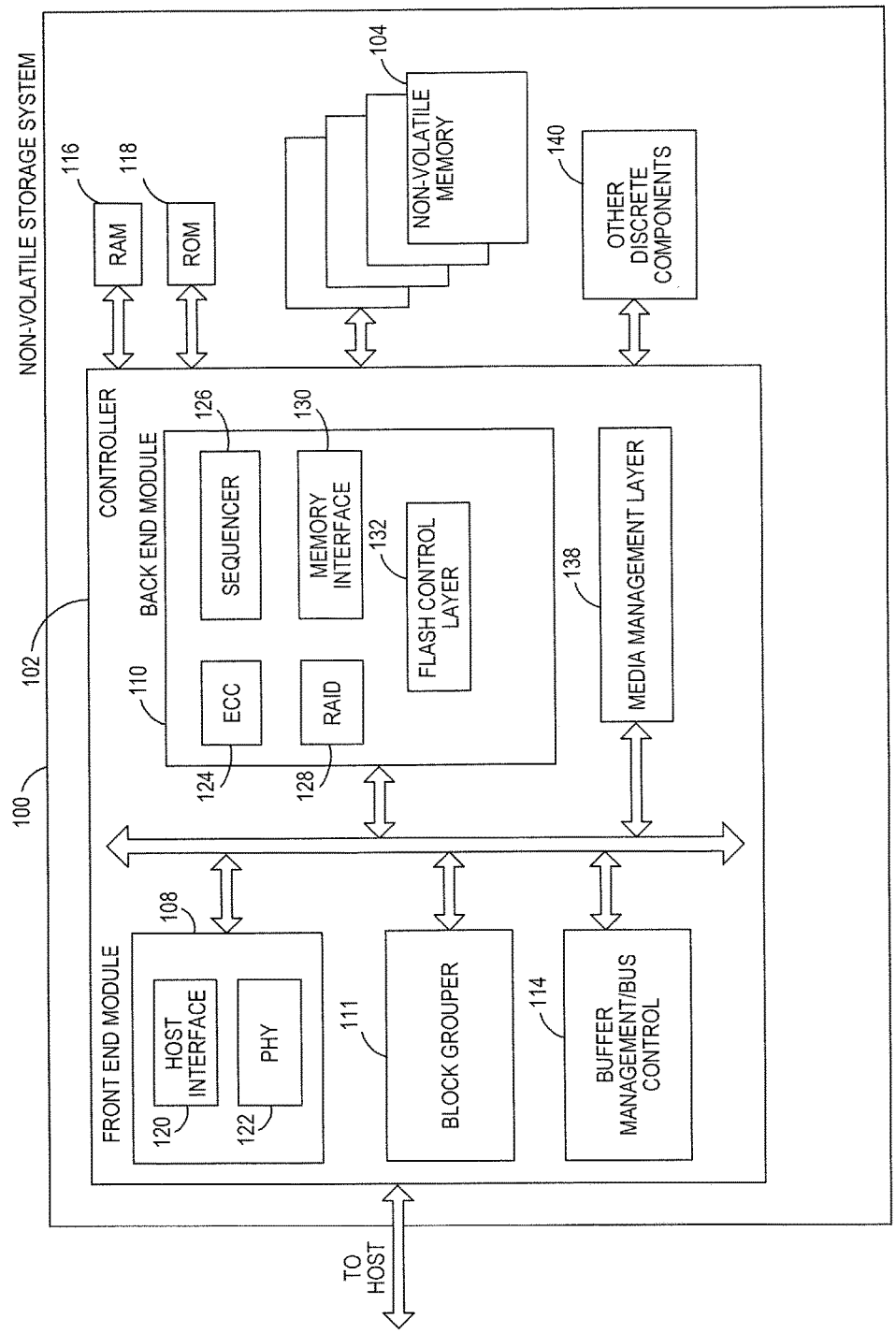
FIG. 2A is a block diagram illustrating exemplary components of the controller of the non-volatile storage system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a block grouper 111, which can be used to execute the algorithms expressed in the accompanying flow charts.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
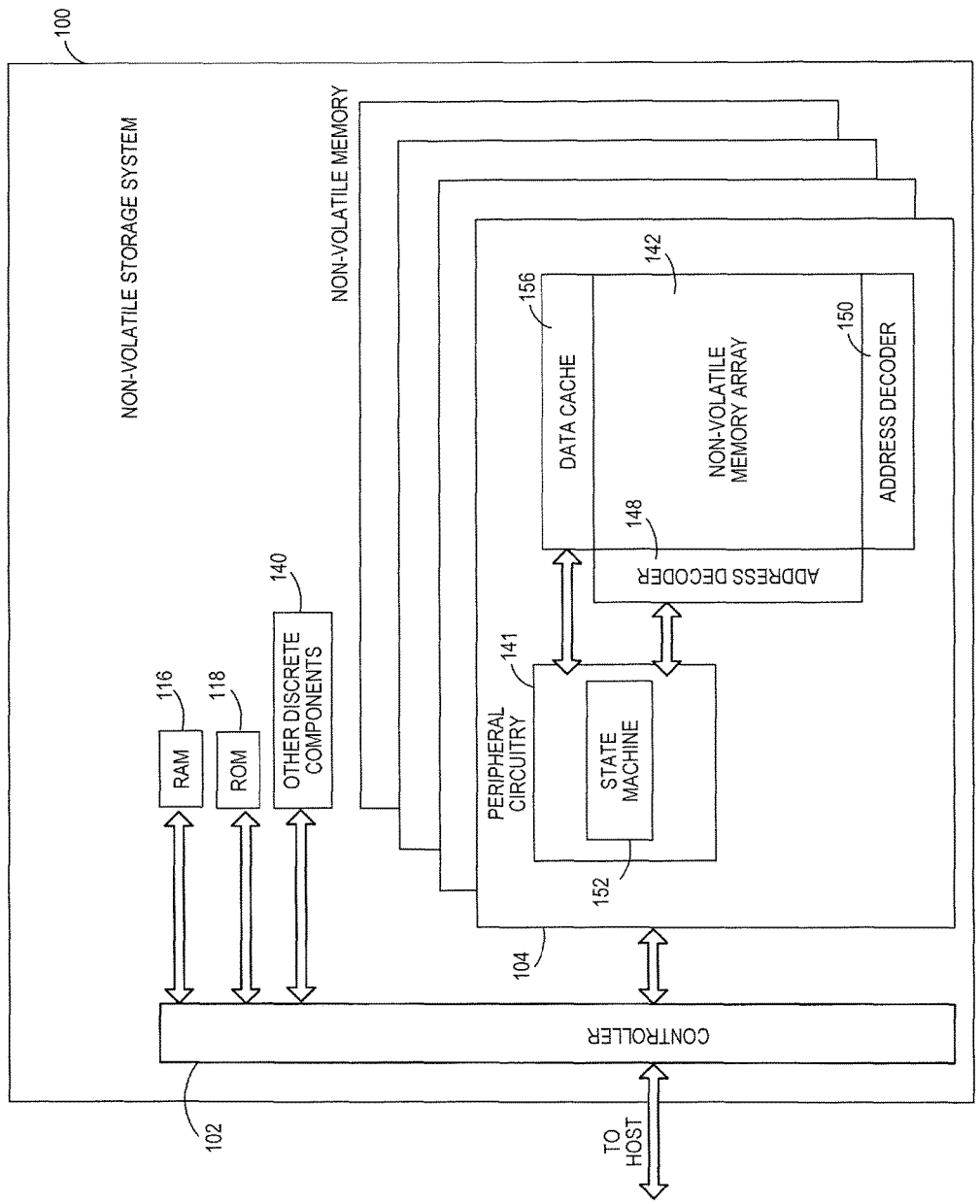
FIG. 2B is a block diagram illustrating exemplary components of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

As discussed above, some prior storage systems contain a memory that is organized into a plurality of memory blocks. Such storage systems can allocate blocks randomly or based on logical block address. For example, a storage system can allocate center blocks (i.e., lowest logical block addresses) for single-bit-per-cell (X1) blocks purely based on address.

These embodiments introduce a method to use data patterns (e.g., NAND data patterns) to infer memory characteristics (e.g., NAND characteristics). In doing so, blocks in memory can be grouped based on NAND characteristics (e.g., program speed). Grouping blocks based on NAND characteristics can improve system performance read times and adaptive wear leveling.

For example, blocks can be pre-assigned to pre-allocated block group with shared optimal read levels based on NAND characteristics. In this way, by grouping blocks together, the storage system 100 can sample one block to determine if it is similar to other blocks (i.e., the storage system 100 can use one sample to optimize for all of the blocks). As another example, the storage system 100 can more quickly find an optimal dynamic read case in a dynamic read table within a group of blocks (i.e., less time is required for searching for the best dynamic read case). Also, certain single-level cell (SLC) control blocks (e.g., storing management data) with specific usage differing from user blocks can be allocated more smartly. So, control blocks can be more smartly allocated to specific blocks based on different control block usage. For example, if a control block has less program/erase cycles but is read-intensive, it can be pre-assigned to blocks that will have less read disturb, thus strengthening the control block reliability. In general, with a storage system 100 that group blocks (e.g., with the block grouper 111 in FIG. 2A) based on reading non-random NAND data patterns, the storage system 100 can solve several problems. One example is read performance.

Prior storage systems trigger the use of dynamic read levels on the NAND when the current NAND default read levels fail to decode. In the case of a consumer solid state drive, currently a dynamic read table with different read level shifts is provided in a table. An embedded storage system may requires distribution scan to acquire the optimal read levels. These shift read levels are acquired on one block but as an attempt to represent multiple blocks. This idea tries to pre-allocate similar blocks beforehand to more-accurately represent NAND variation.

Another example deals with intrinsic NAND variation. The transition from two-dimensional NAND generation-to-generation, to three-dimensional NAND seems to introduce large variation. Blocks and word lines (and strings for BiCS memory) can have large variations in program speed, erase speed, boosting characteristics and program disturb, data retention, and read disturb. If a storage system can group blocks or word lines based on NAND characteristics, the storage system can be more intelligent about assignment of dynamic read levels or group blocks to have common dynamic read case (like pre-assigned groups)

Figure 3:
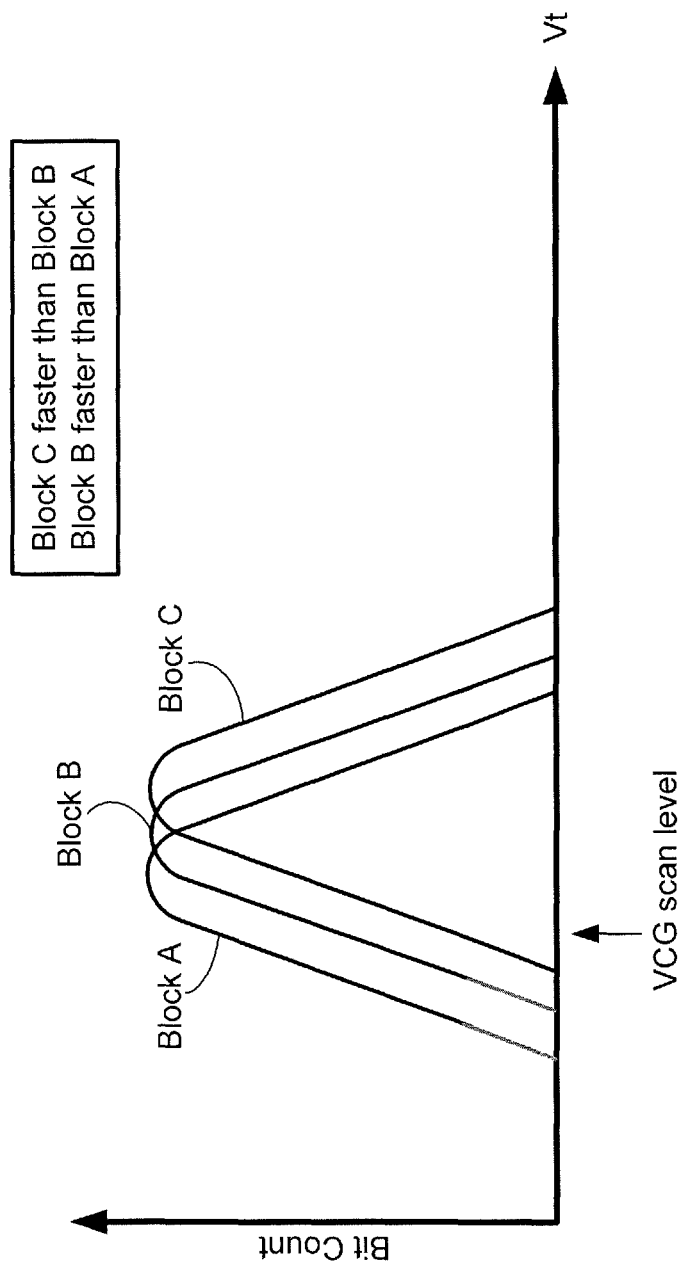
FIG. 3 is a graph of bit count versus voltage of an embodiment.
Figure 4:
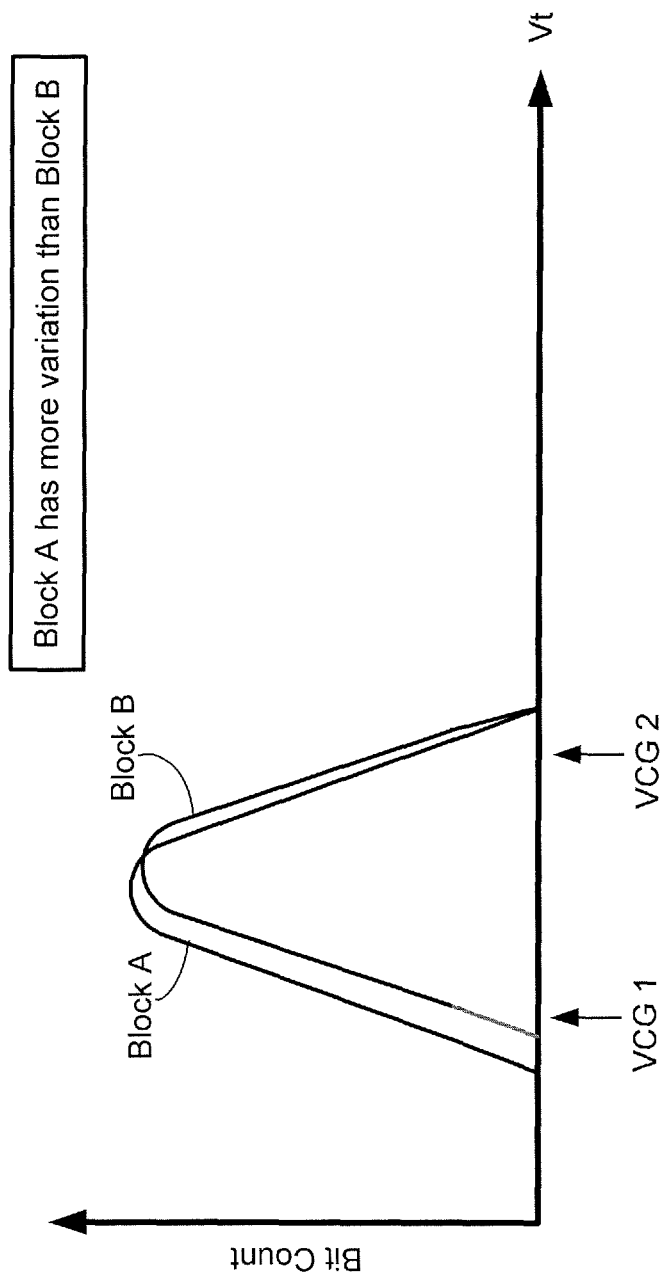
FIG. 4 is a graph of bit count versus voltage of an embodiment.
Figure 5:
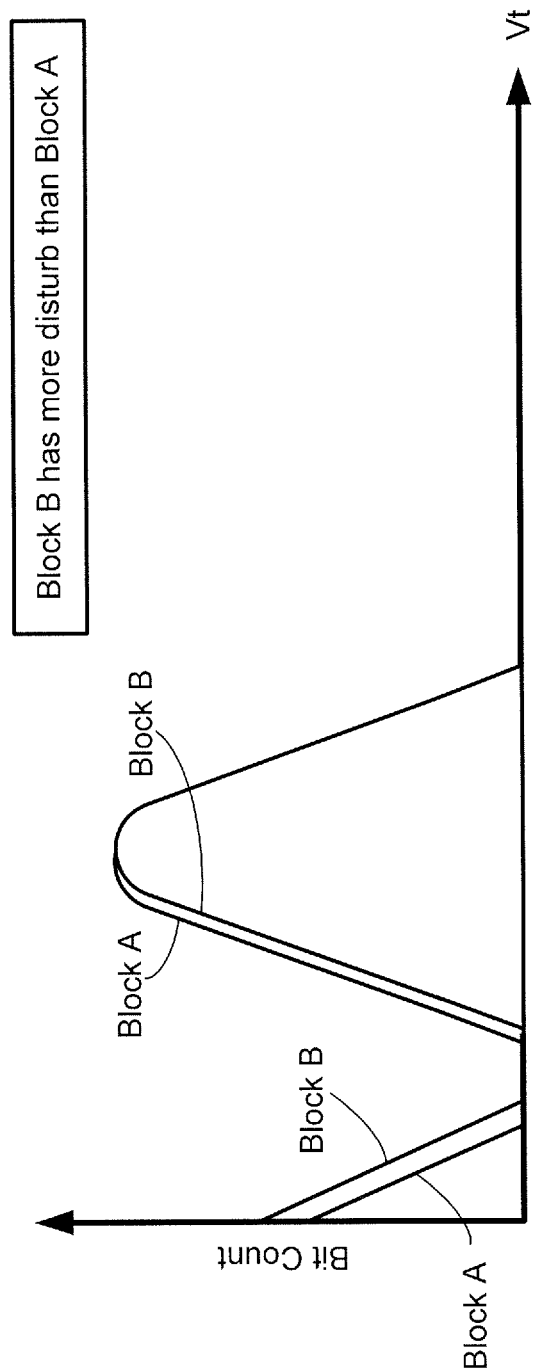
FIG. 5 is a graph of bit count versus voltage of an embodiment.

In these embodiments, the storage system 100 uses deterministic NAND data patterns that are pre-programmed onto the blocks. Upon scanning the data patterns, the storage system 100 can pre-allocate blocks or a subset of blocks that have similar NAND characteristics. FIGS. 3-5 provide examples of this.

In one example (FIG. 3), the storage system 100 uses the flash write pattern that the NAND die 104 is already pre-conditioned in. The storage system 100 takes advantage of the fact that the flash write pattern is an indicator of program speed. FIG. 3 shows examples of three different blocks with different program speed. For the same flash write condition, there are three NAND Vt distributions. The controller 102 can scan all (or a subset of) blocks, setting the VCG voltage level to a fixed level, and the number of conducting bits (0s) and non-conducting bits (1s) for blocks A, B, C can be read and then compared. For the above example, Block A has the most 1s, then Block B, then Block C. From knowing this information, the storage system 100 can group similar blocks in allocated groups indicating program speed. From NAND characteristics, the storage system 100 knows that blocks with faster program speed are easier to disturb (worse program disturb and read disturb). Thus, the controller 102 can track blocks and group them based on similar characteristics. The examples of NAND deterministic patterns and types of reads can be further increased. The trade-off being (1) more complicated system designs versus (2) benefit of more knowledge of NAND characteristics.

Another example (FIG. 4) deals with an increased number of reads. In this example, the storage system 100 keeps the existing flash write pattern and reads at two different VCG levels to see the cell-to-cell Vt variation within one block. If the storage system 100 can distinguish certain blocks as having more natural variation within a block, then one system solution would be to designate this block in SLC (X1) mode instead of TLC (X3) mode, as TLC blocks have less margin for reliability (e.g., TLC Vt distributions have larger FBC after P/E cycles+data retention+temp cross compared to SLC blocks). Counting the number of bits between read levels VCG1 and VCG2 will indicate the variation within the block. If there is a higher number of bits between these read levels (as in Block B in FIG. 4), then this block is a better candidate for the TLC partition, not the SLC partition. The trade-off with this example is that more reads require more times.

Another example (FIG. 5) deals with different NAND data pattern. In programming a NAND block with a deterministic data pattern other than its flash write pattern, other characteristics can be tested. For example, checkerboard patterns (of Erased/Programmed/Erased/Programmed, etc.) can bring out the worst Er upper tail, as shown in FIG. 5. In this case, Block B has worse Er upper tail. Block B will begin to have worse fail bit count at lower PE cycles due to its worse disturb. Blocks in a group similar to block B may be wear-leveled less than blocks like Block A, which can handle higher PE cycles.

Figure 6:
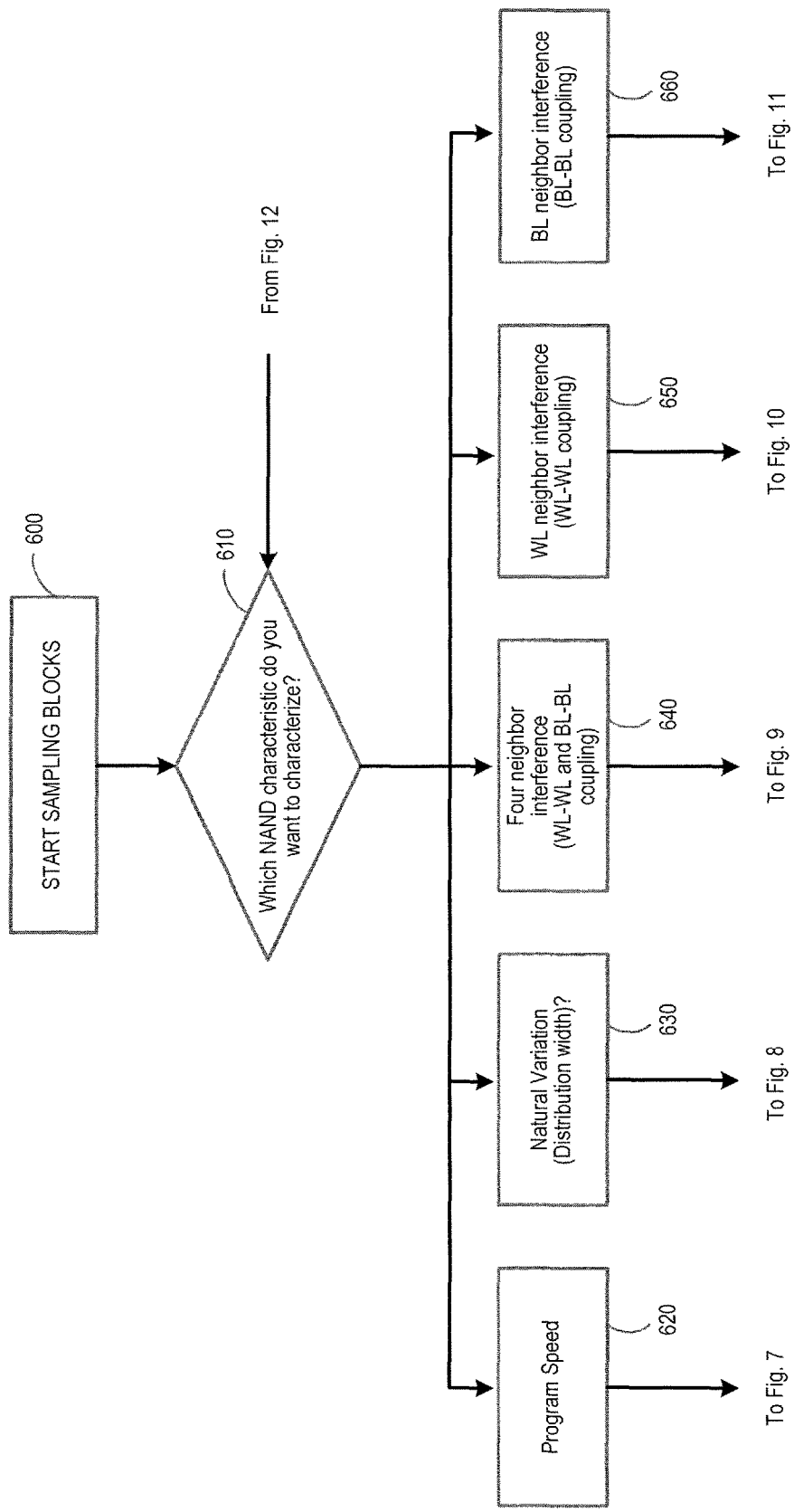
FIG. 6 is a flowchart of a method of an embodiment for grouping blocks based on deterministic data patterns

Return to the drawings, FIG. 6 is a flowchart of a method of an embodiment for grouping blocks based on deterministic data patterns. This method can be implemented as an algorithm executed on the controller 102 (e.g., by the block grouper 111) or by another component in the storage system 100. As shown in FIG. 6, the storage system 100 first starts sampling blocks in memory 104 (act 600). The storage system 100 then determines which NAND characteristic to characterize (act 610). Examples of these characteristics include, but are not limited to, program speed (620), natural variation (distribution width) (630), four neighbor interference (word line to word line and bit line to bit line coupling) (640), word line neighbor interference (word line to word line coupling) (650), and bit line neighbor interference (bit line to bit line coupling) (660). It should be noted that these are merely examples, and other or fewer characteristics can be used. FIGS. 7-11 are flow charts directed to each of these characteristics.

Figure 7:
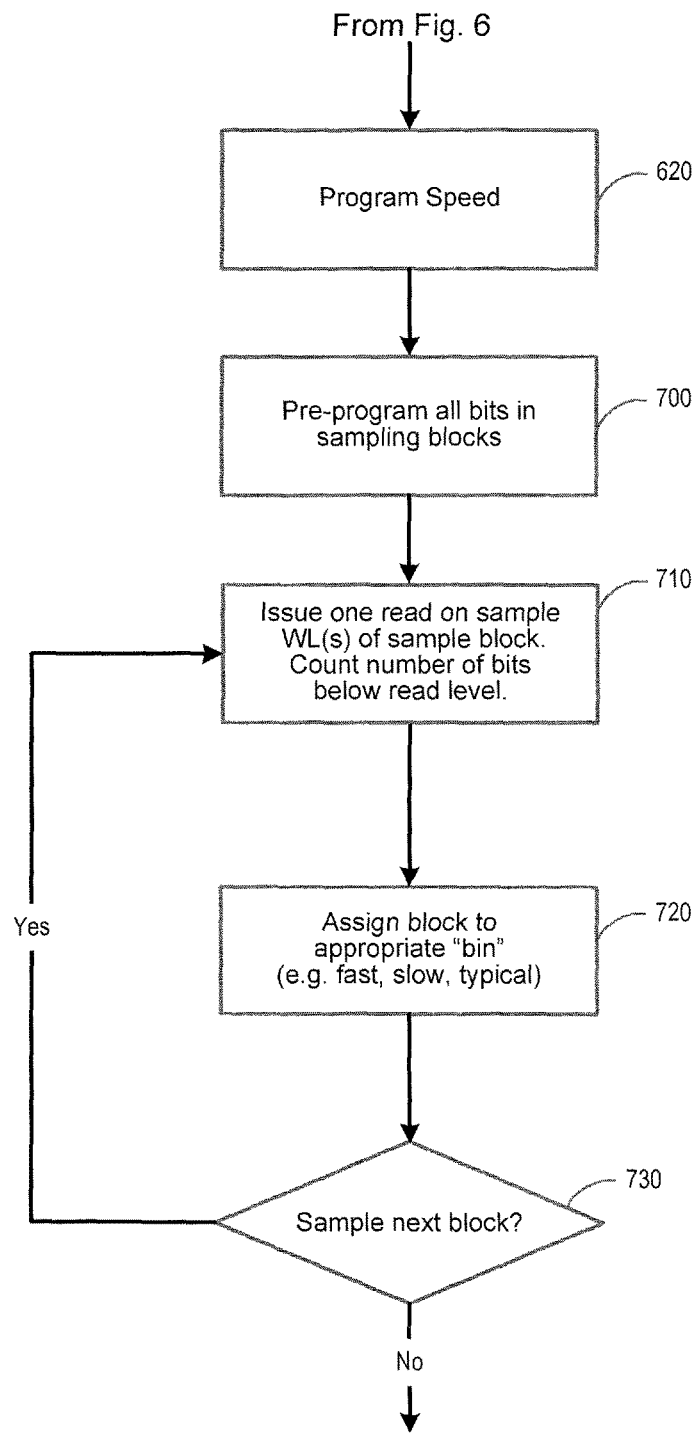
FIG. 7 is a flowchart of a method of an embodiment for characterizing program speed.

FIG. 7 is a flow chart for program speed (620). As shown in FIG. 7, the storage system 100 first pre-programs all the bits in the sampling blocks (act 700). Next, the storage system 100 issues one read on sample word line(s) of the sample block and counts the number of bits below the read level (act 710). Then, the storage system 100 assigns the block to the appropriate "bin" (e.g., fast, slow, typical) (act 720). The storage system 100 then determines whether to sample the next block (act 730).

Figure 8:
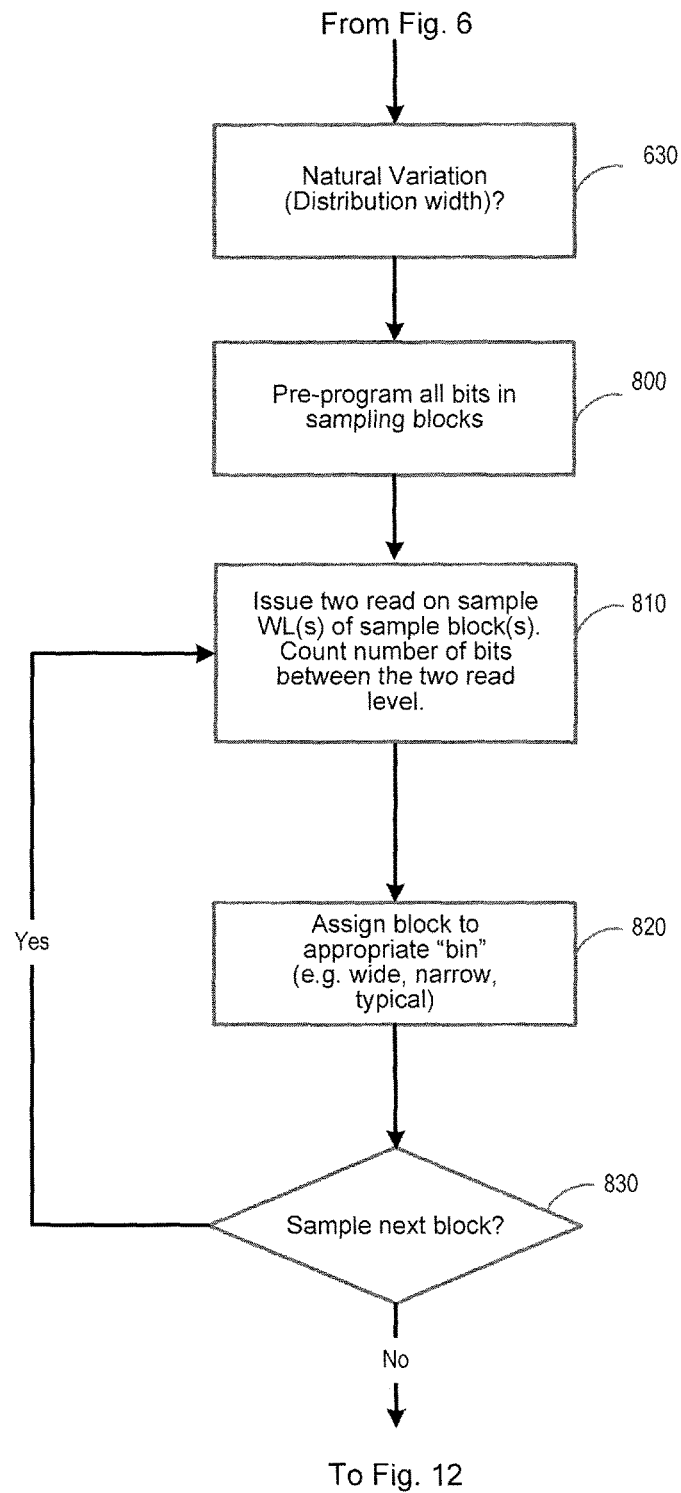
FIG. 8 is a flowchart of a method of an embodiment for characterizing natural variation.

FIG. 8 is a flow chart for natural variation (630). As shown in FIG. 8, the storage system 100 pre-programs all the bits in the sampling block (act 800). The storage system 100 then issues two reads on sample word line(s) of the sample block(s) and counts the number of bits between the two read levels (act 810). Then, the storage system 100 assigns the block to the appropriate "bin" (e.g., wide, narrow, typical) (act 820). The storage system 100 then determines whether to sample the next block (act 830)

Figure 9:
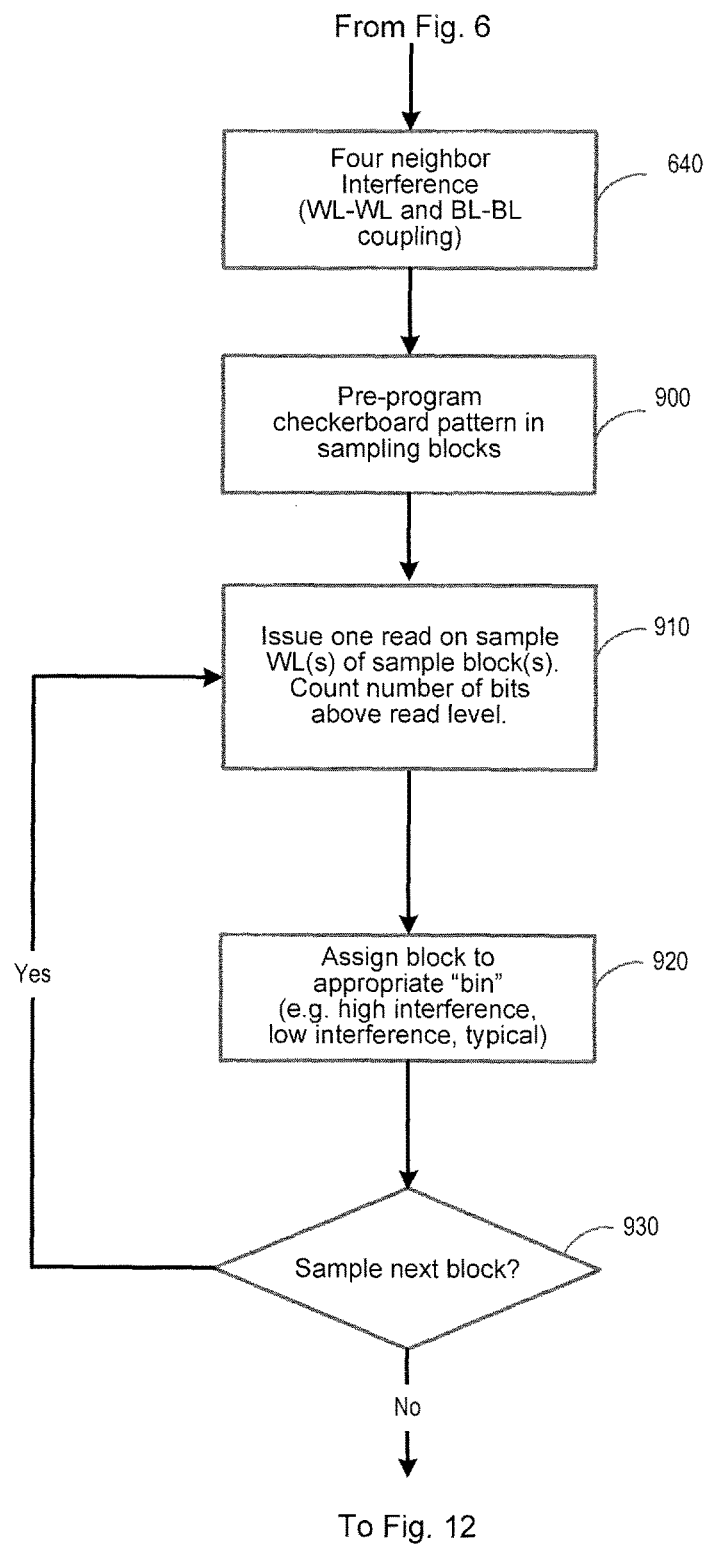
FIG. 9 is a flowchart of a method of an embodiment for characterizing four neighbor inference.

FIG. 9 is a flow chart for four neighbor interference (640). As shown in FIG. 9, the storage system 100 pre-programs a checkboard pattern (i.e., every other cell) in the sampling blocks (act 900). The storage system 100 then issues one read on sample word line(s) of the sample block(s) and counts the number of bits above the read level (act 910). Then, the storage system 100 assigns the block to the appropriate "bin" (e.g., high interference, low interference, typical) (act 920). The storage system 100 then determines whether to sample the next block (act 930).

Figure 10:
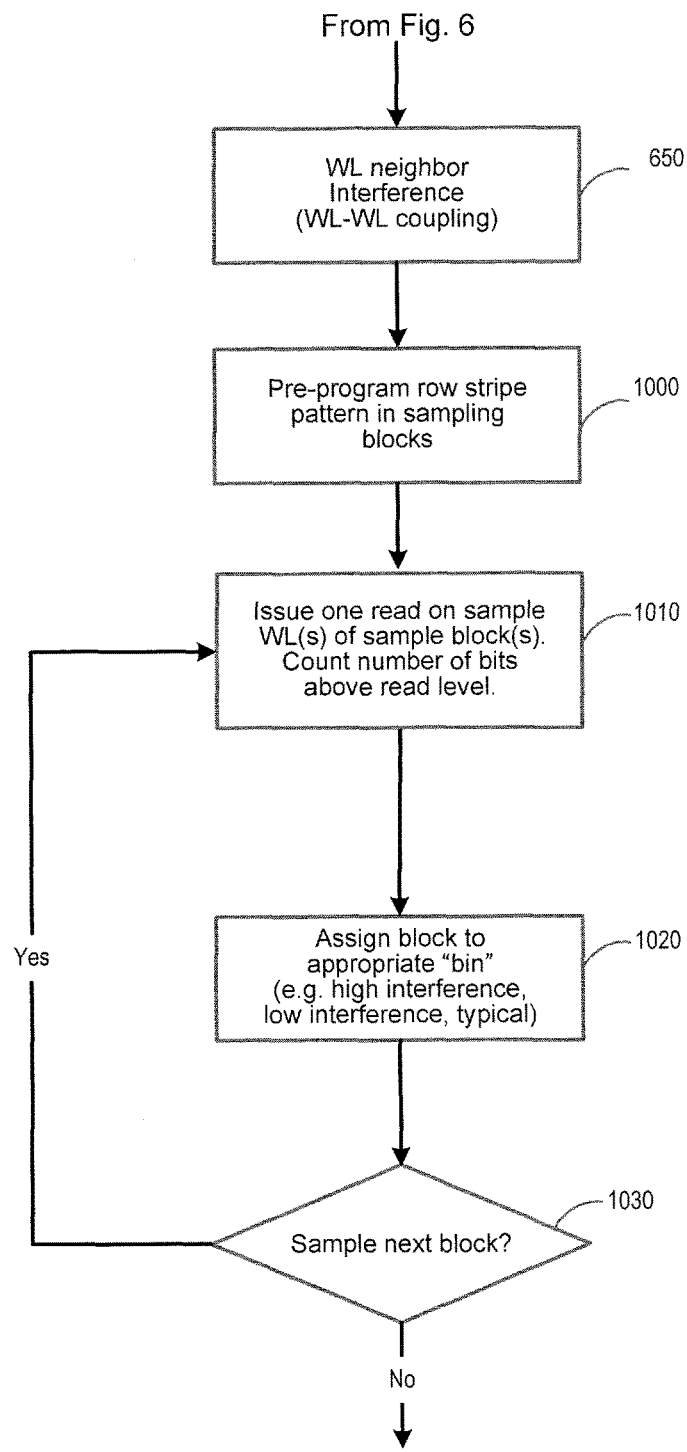
FIG. 10 is a flowchart of a method of an embodiment for characterizing word line neighbor inference.

FIG. 10 is a flow chart for word line neighbor interference (650). As shown in FIG. 10, the storage system 100 pre-programs a row stripe pattern in the sampling blocks (act 1000). The storage system 100 then issues one read on sample word line(s) of the sample block(s) and counts the number of bits above the read level (act 1010). Then, the storage system 100 assigns the block to the appropriate "bin" (e.g., high interference, low interference, typical) (act 1020). The storage system 100 then determines whether to sample the next block (act 1030).

Figure 11:
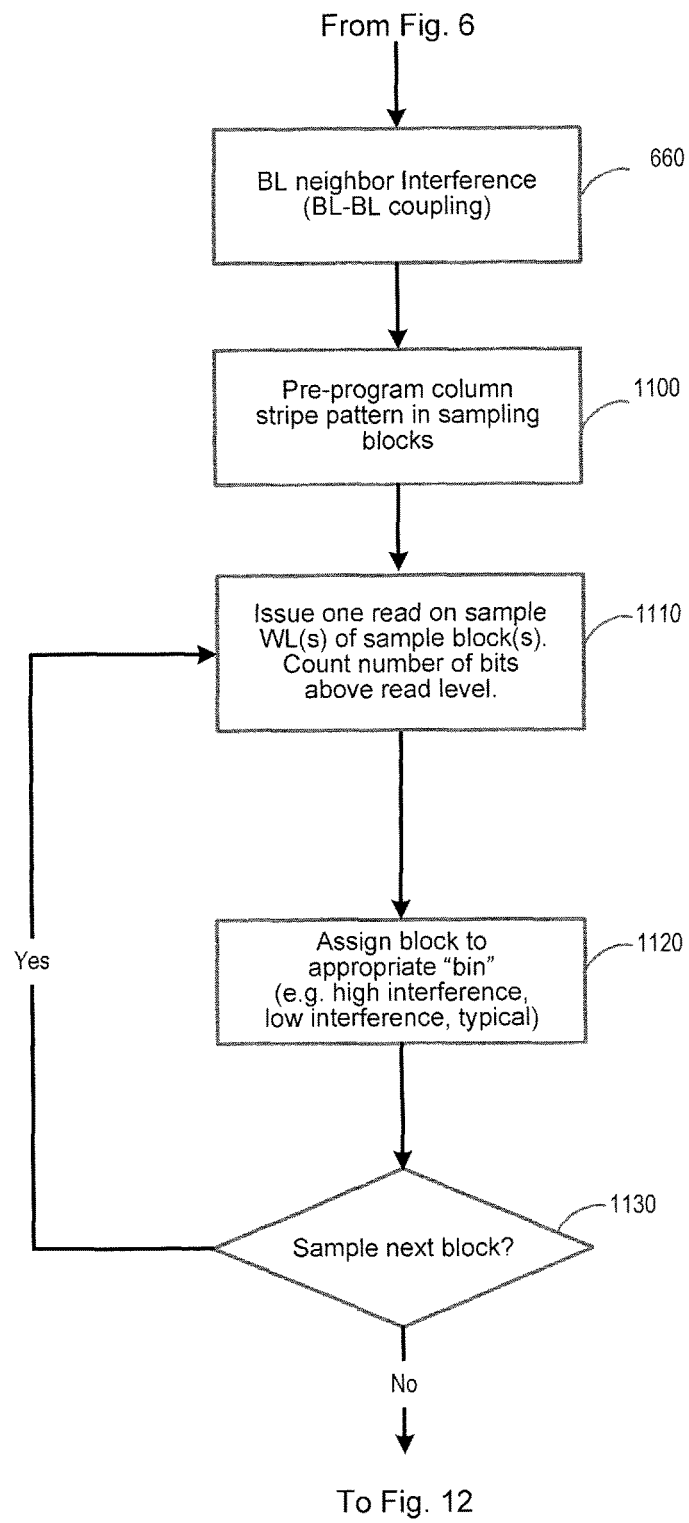
FIG. 11 is a flowchart of a method of an embodiment for determining if another characteristic should be characterized.

FIG. 11 is a flow chart for word line neighbor interference (660). As shown in FIG. 11, the storage system 100 pre-programs a column stripe pattern in the sampling blocks (act 1100). The storage system 100 then issues one read on sample word line(s) of the sample block(s) and counts the number of bits above the read level (act 1110). Then, the storage system 100 assigns the block to the appropriate "bin" (e.g., high interference, low interference, typical) (act 1120). The binning can be done in a variable number of bins. The storage system 100 then determines whether to sample the next block (act 1130).

Figure 12:
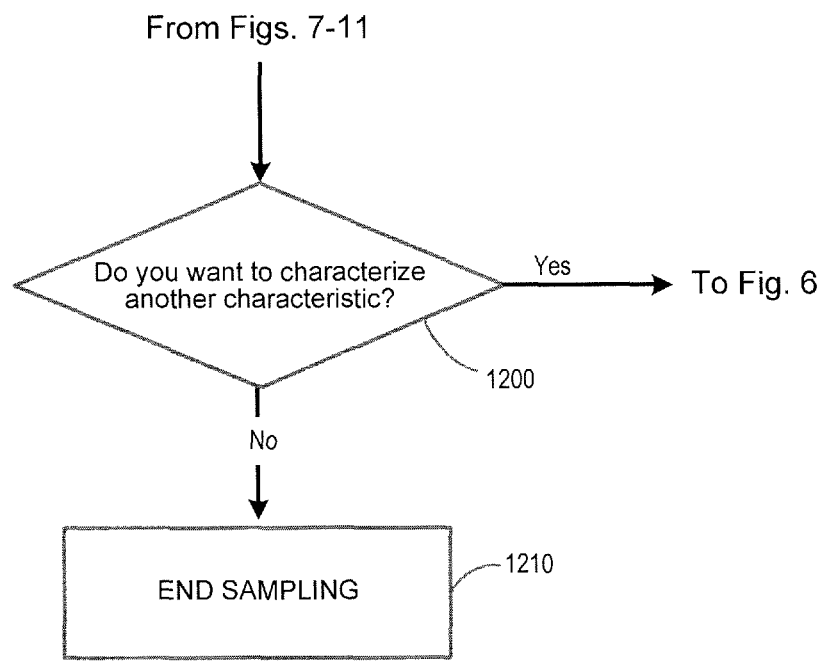
FIG. 12 is a flowchart of a method of an embodiment for determining if sampling should be ended.

FIG. 12 is the part of the flow chart that is done after any of the characterizing of FIGS. 7-11 has been completed. As shown in FIG. 12, the storage system 100 determines if it wants to characterize another characteristic (act 1200). If it does not, the sampling ends (1210). If it does, storage system 100 goes back to act 610 in FIG. 6.

There are several advantages associated with these embodiments. For example, with these embodiments, the storage system 100 can lessen optimal read level search times during system usage as representative blocks are grouped based on NAND characteristics. As another example, with these embodiments, the storage system 100 can improve wear-leveling techniques by sampling blocks and pre-assigning them by group types. Also, the reliability of the storage device 100 can improve as the blocks are pre-sampled and grouped by NAND characteristics. As well, dynamic read tables or optimal read level acquisition could vary less for each block allocation group. For BiCS, this idea can also account for the large word-line-to-word-line variation by pre-sampling subsets of blocks (i.e., word lines).

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:
1. A storage system comprising:
a memory comprising a plurality of blocks; and
a controller in communication with the memory, wherein the controller is configured to:
infer characteristics of the memory from data patterns of data stored in the plurality of blocks; and
group the plurality of blocks based on the inferred characteristics of the memory.

2. The storage system of claim 1, wherein the data pattern comprises one of the following: program every single memory cell in a block and program every other cell in a block.

3. The storage system of claim 1, wherein characteristics of the memory comprises program speed.

4. The storage system of claim 1, wherein characteristics of the memory comprises natural variation.

5. The storage system of claim 1, wherein characteristics of the memory comprises four neighbor interference.

6. The storage system of claim 1, wherein characteristics of the memory comprises word line inference.

7. The storage system of claim 1, wherein characteristics of the memory comprises bit line inference.

8. The storage system of claim 1, wherein the memory comprises a three-dimensional memory.

9. The storage system of claim 1, wherein the storage system is embedded in a host.

10. The storage system of claim 1, wherein the storage system is removably connected to a host.

11. A method for grouping blocks based on deterministic data patterns, the method comprising:
performing the following in a storage system having a memory comprising a plurality of blocks:
programming bits in the plurality of blocks; and
for each block:
reading the programmed bits in the block; and
assigning the block to a block type based on how many of the read bits pass a threshold.

12. The method of claim 11, wherein programming bits comprises one of the following: programming every single memory cell in a block and programming every other cell in a block.

13. The method of claim 11, wherein the block type is a characteristic of program speed.

14. The method of claim 11, wherein the block type is a characteristic of natural variation.

15. The method of claim 11, wherein the block type is a characteristic of four neighbor interference.

16. The method of claim 11, wherein the block type is a characteristic of word line inference.

17. The method of claim 11, wherein the block type is a characteristic of bit line inference.

18. The method of claim 11, wherein the memory comprises a three-dimensional memory.

19. The method of claim 11, wherein the storage system is embedded in a host.

20. The method of claim 11, wherein the storage system is removably connected to a host.

21. A storage system comprising:
a memory comprising a plurality of blocks;
means for analyzing characteristics of the memory from data patterns of data stored in the memory; and
means of categorizing the plurality of blocks of the memory based on the inferred characteristics of the memory.

22. The storage system of claim 21, wherein the memory comprises a three-dimensional memory.

23. The storage system of claim 21, wherein the storage system is embedded in a host.

24. The storage system of claim 21, wherein the storage system is removably connected to a host.

* * * * *